(12) United States Patent
Maeng et al.

(10) Patent No.: US 7,135,349 B2
(45) Date of Patent: Nov. 14, 2006

(54) PHOTODIODE AND METHOD OF FABRICATING THE SAME

(75) Inventors: Kye-Won Maeng, Seoul (KR); Sung-Ryoul Bae, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 216 days.

(21) Appl. No.: 10/970,957

(22) Filed: Oct. 22, 2004

(65) Prior Publication Data

US 2005/0118743 A1 Jun. 2, 2005

(30) Foreign Application Priority Data

Nov. 27, 2003 (KR) .................. 10-2003-0084960

(51) Int. Cl.
*H01L 21/00* (2006.01)
*H01L 31/06* (2006.01)

(52) U.S. Cl. .................. 438/48; 438/57; 438/311; 257/290; 257/461

(58) Field of Classification Search .................. 438/48, 438/57, 93, 94, 311, 356, 357, 360, 442; 257/288, 290, 431, 458, 461–462
See application file for complete search history.

(56) References Cited

U.S. PATENT DOCUMENTS

| | | | | |
|---|---|---|---|---|
| 4,794,439 A | * | 12/1988 | Webb et al. .................. | 257/461 |
| 5,793,790 A | * | 8/1998 | Doi et al. .................. | 257/84 |
| 5,807,780 A | * | 9/1998 | Davis et al. .................. | 438/311 |
| 5,930,635 A | * | 7/1999 | Bashir et al. .................. | 438/313 |
| 6,225,674 B1 | * | 5/2001 | Lim et al. .................. | 257/506 |
| 6,586,317 B1 | * | 7/2003 | Vashchenko et al. ....... | 438/510 |
| 6,930,008 B1 | * | 8/2005 | Nam et al. .................. | 438/322 |

FOREIGN PATENT DOCUMENTS

| | | |
|---|---|---|
| JP | 04-286167 | 10/1992 |
| KR | 10-1999-006160 | 1/1999 |

* cited by examiner

*Primary Examiner*—Kevin M. Picardat
(74) *Attorney, Agent, or Firm*—F.Chau & Associates, LLC

(57) ABSTRACT

Photodiodes and methods of fabricating photodiodes are provided. For example, a method of fabricating a photodiode includes forming a buried layer of a first conductive type on a semiconductor substrate and forming a first intrinsic capping epitaxial layer on the buried layer. A first intrinsic epitaxial layer of the first conductive type is formed on the first intrinsic capping epitaxial layer. A first junction region of the first conductive type is formed in the first intrinsic epitaxial layer. A second intrinsic epitaxial layer of the second conductive type is formed on the first junction region and the first intrinsic epitaxial layer. A second intrinsic capping epitaxial layer is formed on the second intrinsic epitaxial layer. A second junction region of the first conductive type is formed such that the second junction region passes through the second intrinsic capping epitaxial layer and the second intrinsic epitaxial layer. The second junction region contacts the first junction region. A first electrode is formed on a surface of the second junction region and a second electrode is formed on a surface of the second intrinsic capping epitaxial layer.

32 Claims, 8 Drawing Sheets

PHOTODIODE AND METHOD OF FABRICATING THE SAME

CROSS-REFERENCE TO RELATED APPLICATION

This application claims priority to Korean Patent Application No. 03-84960, filed on Nov. 27, 2003, in the Korean Intellectual Property Office, the disclosure of which is incorporated herein in its entirety by reference.

TECHNICAL FIELD

The present invention relates to a semiconductor device and a method of fabricating the same, and more particularly, to a photodiode converting optical signals into electrical signals and a method of fabricating the photodiode.

BACKGROUND

Typically, a photodiode used for an optical element is an optical sensor receiving an electrical signal (i.e., current or voltage) from an optical signal by converting optical energy into electrical energy. A photodiode can be a semiconductor element in which a junction unit of the photodiode has an optical detection function. Such a photodiode utilizes the principle that excessive electrons or holes are generated by photon absorption, thereby modulating the conductivity of the photodiode. That is, the electric current produced by a photodiode varies according to the generation of carriers in response to incident photons. Such a characteristic of a photodiode provides a method of converting optical signals into electrical signals. By converting optical signals into electrical signals, a photodiode can be used as a light-receiving element of a photo pickup device. The photo pickup device reads data or information from optical recording devices such as a CD, a DVD, a DVD R/W, COMBO, COMBI, or Blue ray. A photodiode integrated chip (PDIC) formed by combining a photodiode with a circuit unit is under development. In the PDIC, a signal may be processed by a preamplifier.

Examples of photodiodes include a P-N junction photodiode, a PIN (P type electrode-intrinsic epitaxial layer-N+ type layer-P substrate) photodiode, an NIP (N type electrode-intrinsic epitaxial layer-P+ type layer-P substrate) photodiode, and an avalanche photodiode (APD) using an avalanche multiplication effect. A P-N junction photodiode has a low response speed and bad frequency characteristics. An APD generates noise and consumes a large amount of power. Therefore, PIN photodiodes and NIP photodiodes are typically used.

The performance of a photodiode is evaluated by photoefficiency and frequency characteristics (i.e., bandwidth). A photodiode can achieve high performance if the photodiode has high photoelectric efficiency for wavelengths of detected light and a sufficient response speed.

Conventionally, an intrinsic epitaxial layer of a PIN photodiode or an NIP photodiode is formed to have a particular resistivity and a thickness using a single thin film growth method. When the doping density of the intrinsic epitaxial layer (which may not be an intrinsic semiconductor) increases, the number of current carriers increases, thus improving frequency characteristics. When the doping density of the intrinsic epitaxial layer increases, the probability of electron-hole plasma (EHP) recombination also increases, thus decreasing the photoefficiency of a photodiode. Thus, there is a trade-off relationship between photoefficiency and frequency characteristics of a photodiode. The performance of a photodiode may be improved by optimizing the thickness of an intrinsic epitaxial layer and the density of impurities.

When an intrinsic epitaxial layer is formed using a single thin film growth method, impurities may be out-diffused from a high density P type layer in upper or lower regions of an intrinsic epitaxial layer into an intrinsic epitaxial layer. The impurities may be diffused from a high density N type layer in upper or lower regions of an intrinsic epitaxial layer into an intrinsic epitaxial layer. That is, a high-temperature heat treatment (during an epitaxial layer fabrication, subsequent annealing, or baking) may be performed to form a photodiode or an element including a photodiode. During such a heat treatment, impurities such as a dopant diffuse from the high density P type or N type layer to the intrinsic epitaxial layer. The diffusion of impurities into the intrinsic epitaxial layer decreases the performance of a photodiode.

Referring to FIG. 1, a sectional view of a conventional NIP photodiode is shown. A high density P-type buried layer 2, a P type first intrinsic epitaxial layer 3, an N type second intrinsic epitaxial layer 5, and an N+ type high density layer 8 for contacting with a cathode are formed on a P type semiconductor substrate 1. A first P type junction region 4 is formed in the P type first intrinsic epitaxial layer 3. A second P type junction region 6 is formed in the N type second intrinsic epitaxial layer 5. A P+ type layer 9b contacting with an anode formed in the P type junction region 6 contacts a metal distributing structure 11 of an anode electrode. A P+ type dividing layer 9a is formed on the N type intrinsic epitaxial layer 5 to divide a light receiving unit of a photodiode. The metal distributing structure 11, which is an anode electrode, is insulated by an interlayer insulating layer 10 and an intermetal insulating layer 12. An element separating layer 7 formed by Local Oxidation of Silicon (LOCOS) electronically separates a photodiode from adjacent elements. A silicon oxide ($SiO_2$) layer 14 and a silicon nitride (SiN) layer 15 form an anti-reflective coating (ARC) 16 for blocking the reflection of light projected on the light-receiving unit of the photodiode.

Growing the epitaxial layers 3 and 5 can be performed in a high temperature of about 1100□ to about 1150□ to fabricate the conventional NIP type photodiode shown in FIG. 1. Forming a subsequent element can be performed in a heat treatment such as annealing or baking. The heat treatment out-diffuses impurities from the high density P-type buried layer 2 into the P type first intrinsic epitaxial layer 3. The heat treatment diffuses impurities from the high density N+ type layer 8 into the N type second intrinsic epitaxial layer 5. Such diffusion or out-diffusion decreases the performance of the photodiode. That is, when impurities are diffused to the intrinsic epitaxial layers 3 and 5 due to a high-temperature heat treatment, the thicknesses of the intrinsic epitaxial layers 3 and 5 are substantially reduced, and the capacitances of the intrinsic epitaxial layers 3 and 5 are increased. As a result, frequency may be reduced. The diffusion of the impurities decreases a depletion layer, thus also decreasing photoefficiency. A conventional PIN photodiode has similar problems with a conventional NIP photodiode.

SUMMARY OF THE INVENTION

Exemplary embodiments of the invention include methods for fabricating photodiodes in which photoefficiency and frequency characteristics may be improved by preventing impurities from diffusing or out-diffusing from a high density layer to an intrinsic epitaxial layer during a process of forming an element or a subsequent heat-treating.

Exemplary embodiments further include photodiodes in which diffusion or out-diffusion into an intrinsic epitaxial layer is suppressed.

In one exemplary embodiment of the present invention, a method of fabricating a photodiode comprises forming a buried layer of a first conductive type in a semiconductor substrate and forming a first intrinsic capping epitaxial layer on the buried layer; forming a first intrinsic epitaxial layer of the first conductive type on the first intrinsic capping epitaxial layer and forming a first junction region of the first conductive type in the first intrinsic epitaxial layer; forming a second intrinsic epitaxial layer of a second conductive type in the a first junction region and in the first intrinsic epitaxial layer; forming a second intrinsic capping epitaxial layer on the second intrinsic epitaxial layer; forming a second junction region of the first conductive type such that the second junction region passes through the second intrinsic capping epitaxial layer and the second intrinsic epitaxial layer, and contacts the first junction region; and forming a first electrode on a surface of the second junction region and forming a second electrode on a surface of the second intrinsic capping epitaxial layer.

According to another exemplary embodiment of the present invention, a method of fabricating a photodiode comprises forming a first conductive type buried layer on a semiconductor substrate and forming an intrinsic capping epitaxial layer on the buried layer; forming a first intrinsic epitaxial layer of the first conductive type on the intrinsic capping epitaxial layer and forming a first junction region of the first conductive type in the first intrinsic epitaxial layer; forming a second intrinsic epitaxial layer of a second conductive type in the a first junction region and in the first intrinsic epitaxial layer; forming a second intrinsic capping epitaxial layer on the second intrinsic epitaxial layer; forming a second junction region of the first conductive type such that the second junction region passes through the second intrinsic capping epitaxial layer and the second intrinsic epitaxial layer, and contacts the first junction region; and forming a first electrode on a surface of the second junction region and forming a second electrode on a surface of the second intrinsic capping epitaxial layer.

According to yet another exemplary embodiment of the present invention, a method of fabricating a photodiode comprises forming a first conductive type buried layer on a semiconductor substrate and forming a first intrinsic epitaxial layer of the first conductive type on the buried layer; forming a first junction region of the first conductive type in the first intrinsic epitaxial layer; forming a second intrinsic epitaxial layer of a second conductive type in the first junction region and the first intrinsic epitaxial layer; forming an intrinsic capping epitaxial layer on the second intrinsic epitaxial layer; forming a second junction region of the first conductive type such that the second junction region passes through the intrinsic capping epitaxial layer and the second intrinsic epitaxial layer and contacts the first junction region; and forming a first electrode on a surface of the second junction region and forming a second electrode on a surface of the intrinsic capping epitaxial layer.

In one exemplary embodiment of the invention, forming the first electrode on the upper surface of the second junction region may include forming a high density doping layer of the first conductive type in the second junction region and forming a first electrode in contact with the high density doping layer of the first conductive type. Further, forming the second electrode on the upper surface of the intrinsic capping epitaxial layer may include forming a high density doping layer of the second conductive type in the intrinsic capping epitaxial layer and forming the second electrode in contact with the high density doping layer. Another exemplary embodiment of the invention may further include forming a high density doping layer of the first conductive type separating a light receiving unit of the photodiode on the second intrinsic epitaxial layer. Also, the method may further include forming a reflective layer.

According to another exemplary embodiment of the present invention, a photodiode comprises a semiconductor substrate, a buried layer of a first conductive type on the semiconductor substrate, a first intrinsic capping epitaxial layer on the buried layer, a first intrinsic epitaxial layer of the first conductive type formed on the first intrinsic capping epitaxial layer, a second intrinsic epitaxial layer of a second conductive type formed on the first intrinsic capping epitaxial layer, a second intrinsic capping epitaxial layer on the second intrinsic epitaxial layer, a first junction region of the first conductive type formed in the first intrinsic epitaxial layer, a second junction region of the first conductive type passing through the second intrinsic capping epitaxial layer and the second intrinsic epitaxial layer and contacting the first junction region, a first electrode on a surface of the second junction region, and a second electrode on a surface of the second intrinsic capping epitaxial layer.

According to another exemplary embodiment of the present invention, a photodiode comprises a semiconductor substrate, a buried layer of a first conductive type on the semiconductor substrate, an intrinsic capping epitaxial layer on the buried layer, a first intrinsic epitaxial layer of the first conductive type on the intrinsic capping epitaxial layer, a second intrinsic epitaxial layer of a second conductive type on the first intrinsic epitaxial layer, a first junction region of the first conductive type formed in the first intrinsic epitaxial layer, a second junction region of the first conductive type passing through the second intrinsic epitaxial layer and contacting the first junction region, a first electrode on a surface of the second junction region, and a second electrode on a surface of the second intrinsic epitaxial layer.

According to another exemplary embodiment of the present invention, a photodiode comprises a semiconductor substrate, a buried layer of a first conductive type on the semiconductor substrate, a first intrinsic epitaxial layer of the first conductive type on the buried layer, a second intrinsic epitaxial layer of a second conductive type on buried layer, an intrinsic capping epitaxial layer on the second intrinsic epitaxial layer, a first junction region of the first conductive type formed in the first intrinsic epitaxial layer, a second junction region of the first conductive type passing through the intrinsic capping epitaxial layer and the second intrinsic epitaxial layer and contacting the first junction region, a first electrode on a surface of the second junction region, and a second electrode on a surface of the second intrinsic capping epitaxial layer.

These and other exemplary embodiments, aspects, features, and advantages of the present invention will become more apparent by describing in detail exemplary embodiments thereof with reference to the attached drawings.

DETAILED DESCRIPTION OF EXEMPLARY EMBODIMENTS

Figure 1:
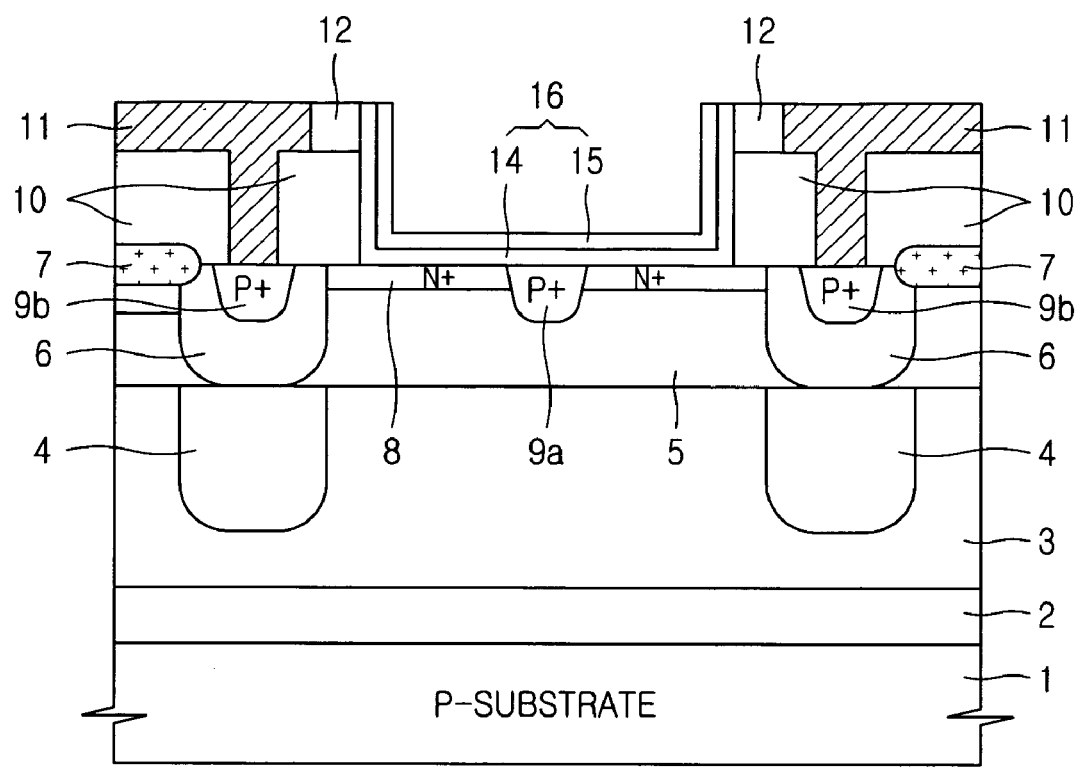
FIG. 1 is a sectional view of a conventional NIP photodiode.

Exemplary embodiments of the present invention will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals throughout the specification denote like elements. In the drawings, schematic illustrations are depicted wherein, the thickness of layers and regions are exaggerated for clarity.

A method of fabricating an NIP photodiode according to exemplary embodiments of the present invention will be described. Also, a splitting photodiode of common anode is described. Those skilled in the art will know that the exemplary embodiments of the present invention may be applied to a PIN photodiode by switching first conductive type elements with opposite conductive type elements.

Figure 2:
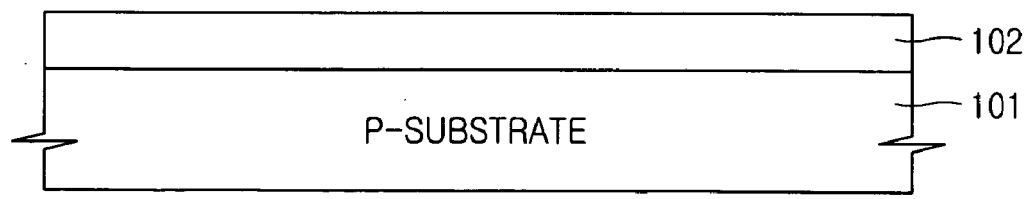
FIGS. 2 through 12 are sectional views illustrating a method of fabricating a photodiode according to an exemplary embodiment of the present invention.

FIGS. 2 through 12 are cross-sectional schematic views of a semiconductor device, illustrating a method of fabricating a photodiode according to an exemplary embodiment of the present invention. Referring to FIG. 2, a P-type buried layer (PBL) 102 is formed on a P type semiconductor substrate 101. The PBL 102 has a higher density than the semiconductor substrate 101 or epitaxial layers (103 or 103' of FIG. 3). For example, the PBL 102 may be formed by a heat diffusion process after impurities such as Boron (B) are injected with a high density of 1E19 ions/cm$^3$.

Figure 3:
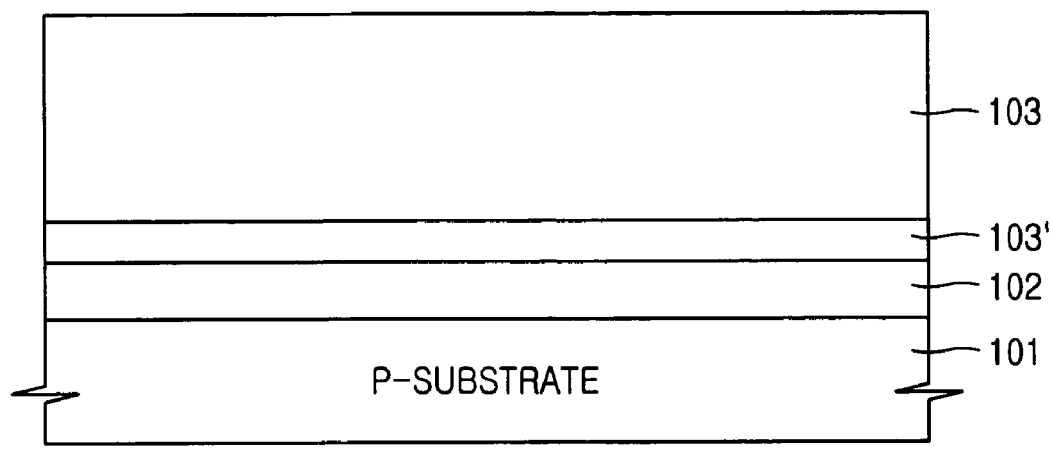

Referring to FIG. 3, a first intrinsic capping epitaxial layer 103' is formed on the PBL 102. A P type intrinsic epitaxial layer 103 is formed on the first intrinsic capping epitaxial layer 103'. The first intrinsic capping epitaxial layer 103' functions as a buffer layer preventing out-diffusion from the high density PBL 102 to the P type intrinsic epitaxial layer 103. That is, during the process of forming the p type intrinsic epitaxial layer 103 or a heat treatment, dopant impurities out-diffuse to the first intrinsic capping epitaxial layer 103'. However, the dopant impurities are prevented from out-diffusing to the P type intrinsic epitaxial layer 103 due to the first intrinsic capping epitaxial layer 103' disposed between the high density PBL 102 and the P type intrinsic epitaxial layer 103.

The thickness and the resistivity of the P type intrinsic epitaxial layer 103 are factors for determining performance of the photodiode. For example, the thickness of the P type intrinsic epitaxial layer 103 may be about 8□ to about 12□ and the resistivity may be about 100 Ω□□ to about 200 Ω□□. The out-diffusion of impurities into the P type intrinsic epitaxial layer 103 should be eliminated because the thickness and the resistivity of the P type intrinsic epitaxial layer 103 may be changed by the impurities that enter the P type intrinsic epitaxial layer 103. The first intrinsic capping epitaxial layer 103' functions as a buffer layer preventing impurities from out-diffusing into the P type intrinsic epitaxial layer 103. The first intrinsic capping epitaxial layer 103' may be grown without doping. Alternatively, the first intrinsic capping epitaxial layer 103' may be grown with a doping density lower than that of the P type intrinsic epitaxial layer 103. The first intrinsic capping epitaxial layer 103' can be grown to a thickness in consideration of the distance to which out-diffusing from the high density PBL 102 occurs. The thickness can be determined so that the dopant impurities in the PBL 102 can not out-diffuse into the P type intrinsic epitaxial layer 103.

Figure 4:
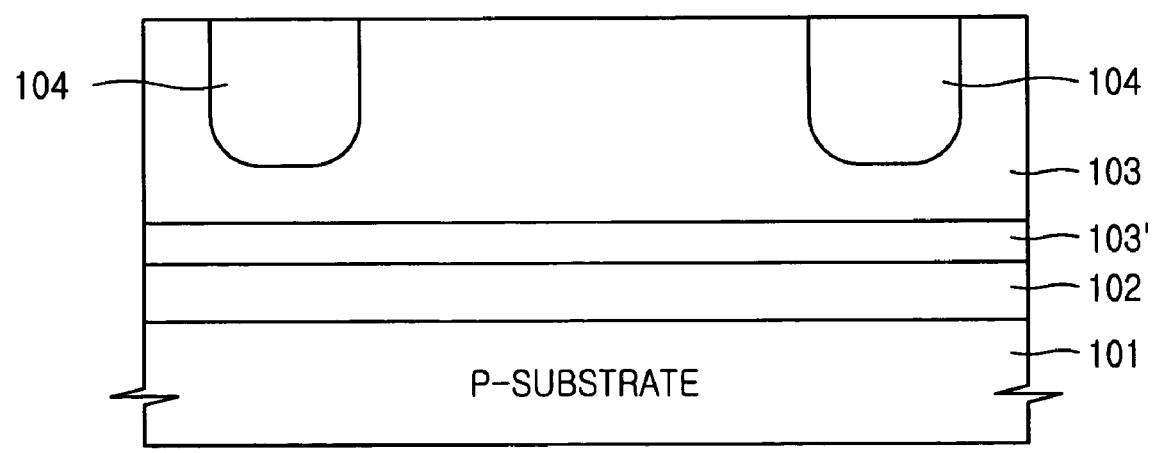

Referring to FIG. 4, a P type first junction region 104 is formed in the P type intrinsic epitaxial layer 103. The P type first junction region 104 forms an electric current path by being connected to an anode electrode via a P type second junction region 106 (see FIG. 6). The P type first junction region 104 is formed with a higher doping density than the P type intrinsic epitaxial layer 103 to have sufficient conductivity.

Figure 5:
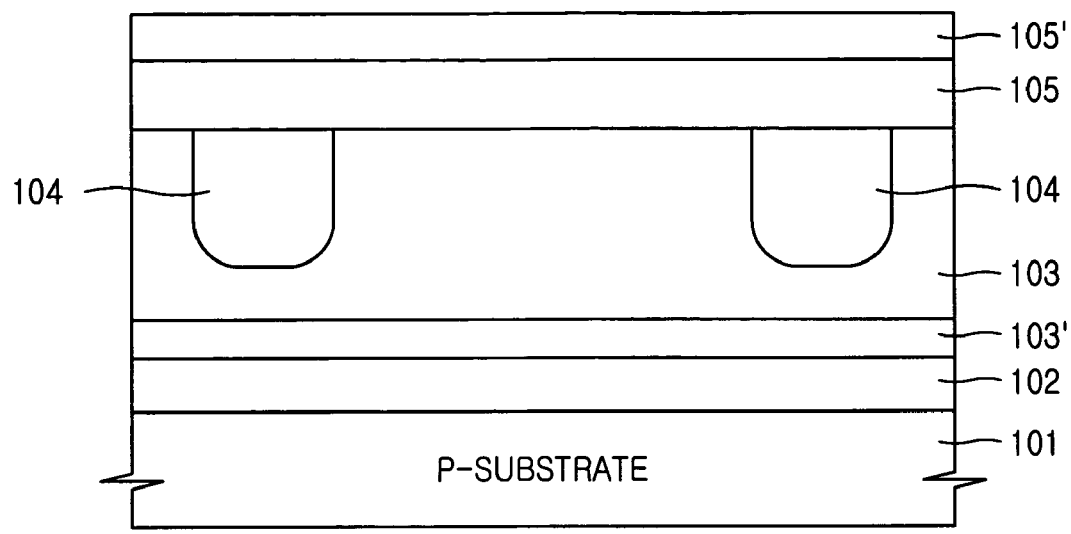
Figure 6:
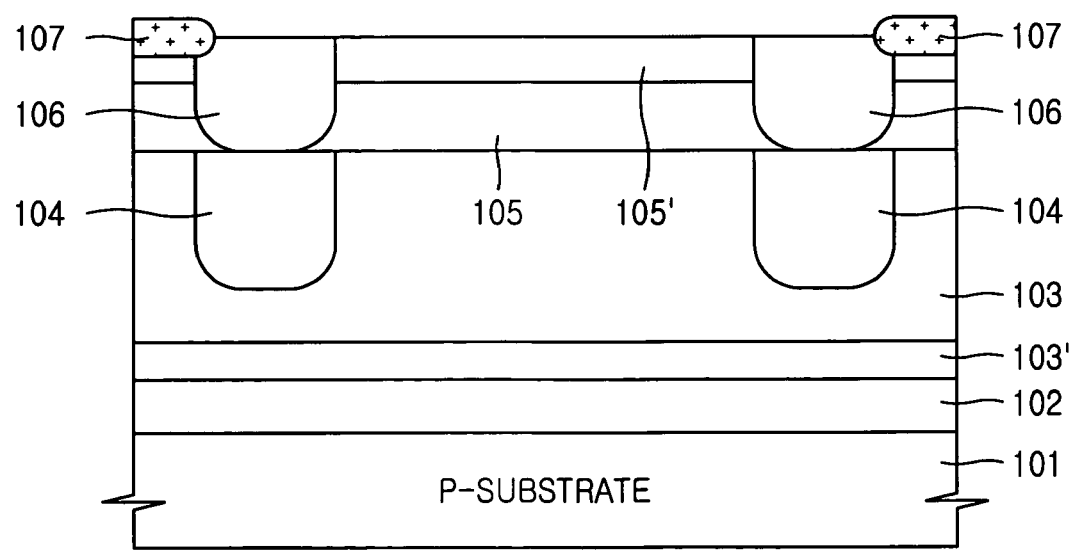

Referring to FIG. 5, an N type intrinsic epitaxial layer 105 is formed on the surface of the P type intrinsic epitaxial layer in which the P type first junction region 104 is formed. The N type intrinsic epitaxial layer 105 forms an intrinsic epitaxial layer of the NIP photodiode with the P type intrinsic epitaxial layer 103. Most of the light absorption is performed by the intrinsic epitaxial layers 103 and 105. Similar to the P type intrinsic epitaxial layer 103, the thickness and the resistivity of the N type intrinsic epitaxial layer 105 may determine the performance of the photodiode. A second intrinsic capping epitaxial layer 105' is grown on the N type intrinsic epitaxial layer 105. The second intrinsic capping epitaxial layer 105' may be grown without doping. Alternatively, the second intrinsic capping epitaxial layer 105' may be grown with a lower N type doping density than that of the N type intrinsic epitaxial layer 105. The second intrinsic capping epitaxial layer 105' may be grown with a thickness in consideration of the distance to which diffusion of impurities from a high density N+ type doping layer 108 (see FIG. 7) occurs.

The second intrinsic capping epitaxial layer 105' functions as a buffer layer preventing dopant impurities in the high density N+ type doping layer 108 from diffusing to the N type intrinsic epitaxial layer 105. The prevention of diffusion of the dopant impurities may allow the N type intrinsic epitaxial layer 105 to maintain the thickness and the resistivity of the N type intrinsic epitaxial layer 105 constant. Thus, high performance of the photodiode can be achieved. An isolation layer 107 is formed to separate the photodiode from other layers. The isolation layer 107 may be formed by conventional LOCOS or shallow trench isolation (STI).

Figure 7:
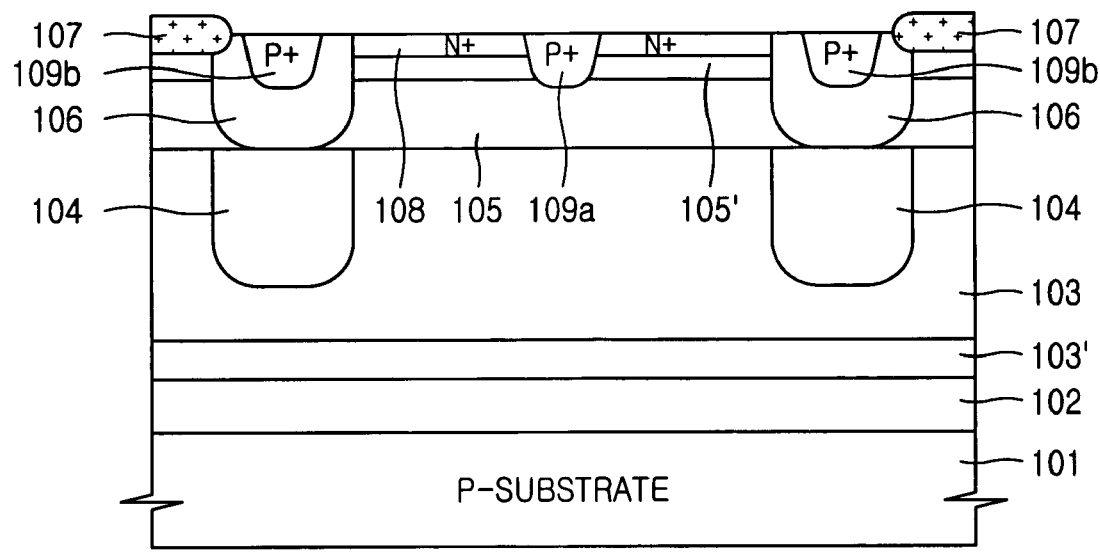

Referring to FIG. 7, a high density N+ type doping layer 108 is formed in the second intrinsic capping epitaxial layer 105'. The N+ type doping layer 108, which may decrease contact resistance of a cathode electrode, can be formed with a shallow junction. A high density P+ type doping layer 109$b$ is formed in the P type second junction region 106 to decrease contact resistance with an anode. A high density P+ type doping layer 109$a$ dividing the N+ type doping layer 108 is formed. The P+ type doping layer 109$a$ divides a light receiving unit of the photodiode.

Figure 8:
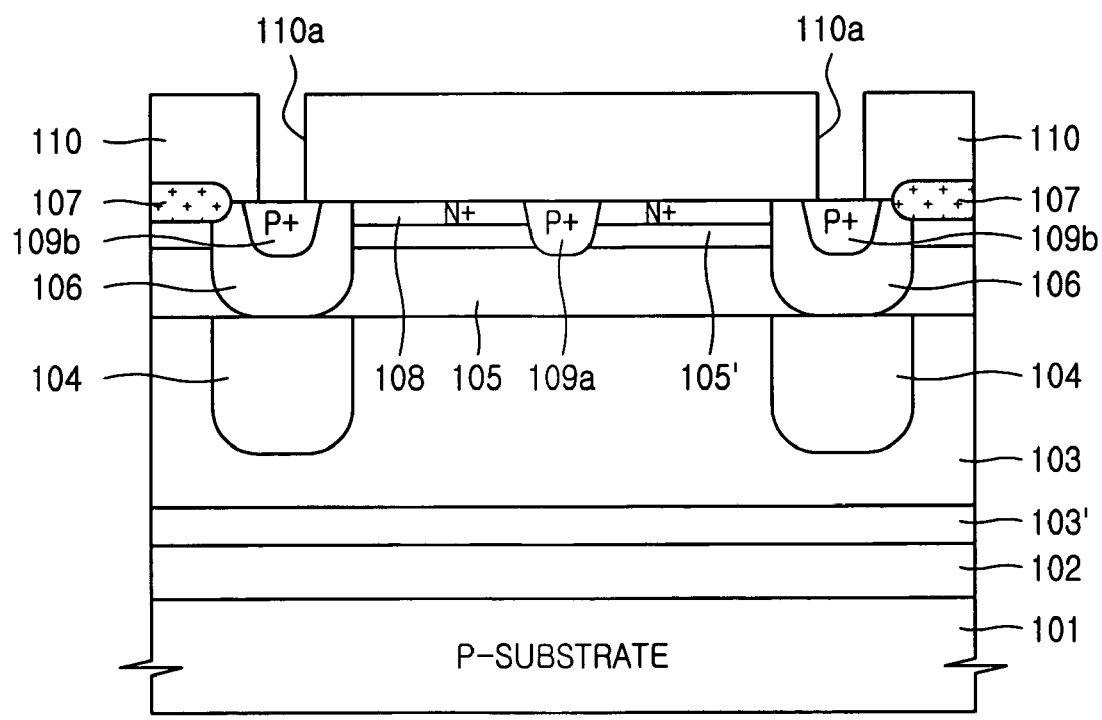
Figure 9:
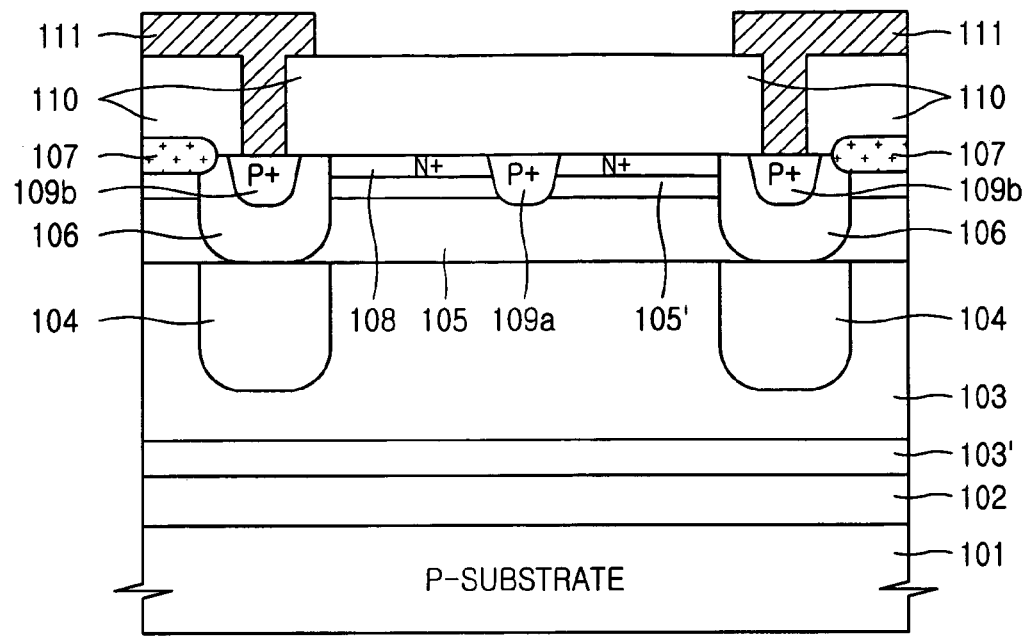
Figure 10:
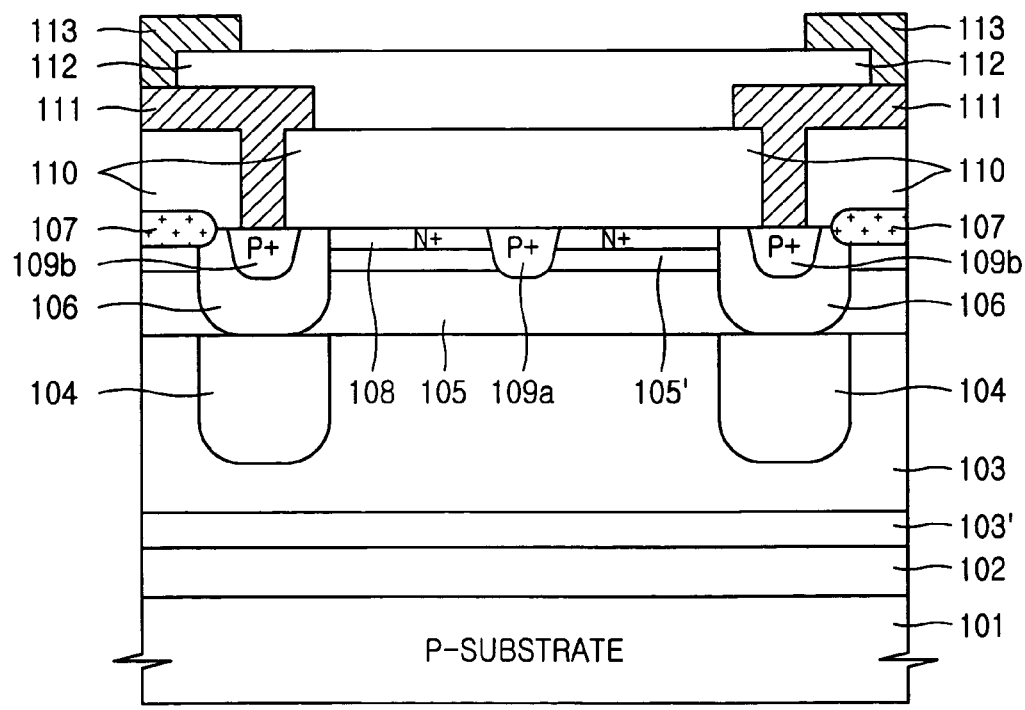

FIGS. 8 through 10 illustrate methods for forming an anode electrode and a cathode electrode on the P+ type doping layer 109$b$ and the N+ type doping layer 108, respectively, and forming a metal interconnecting structure on each electrode.

More specifically, referring to FIG. 8, an interlayer insulating layer 110 is formed on the surface of the resultant structure including the N+ type doping layer 108 and the P+ type doping layers 109a and 109b. A contact hole 110a is formed in the interlayer insulating layer 110 to expose the P+ type doping layer 109b.

Referring to FIG. 9, an anode electrode 111, which is a metal interconnecting structure in contact with the P+ type doping layer 109b, is formed by patterning a metal layer. The metal layer buries the contact holes 110a (shown in FIG. 8). Alternatively, a cathode electrode (not shown) may be formed to be in contact with the N+ type doping layer 108 when an anode electrode 111 is formed. Referring to FIG. 10, an intermetal insulating layer 112 is formed on the anode electrode 111. An upper metal distributing structure 113 in contact with the anode electrode 111 is formed on the intermetal insulating layer 112.

Figure 11:
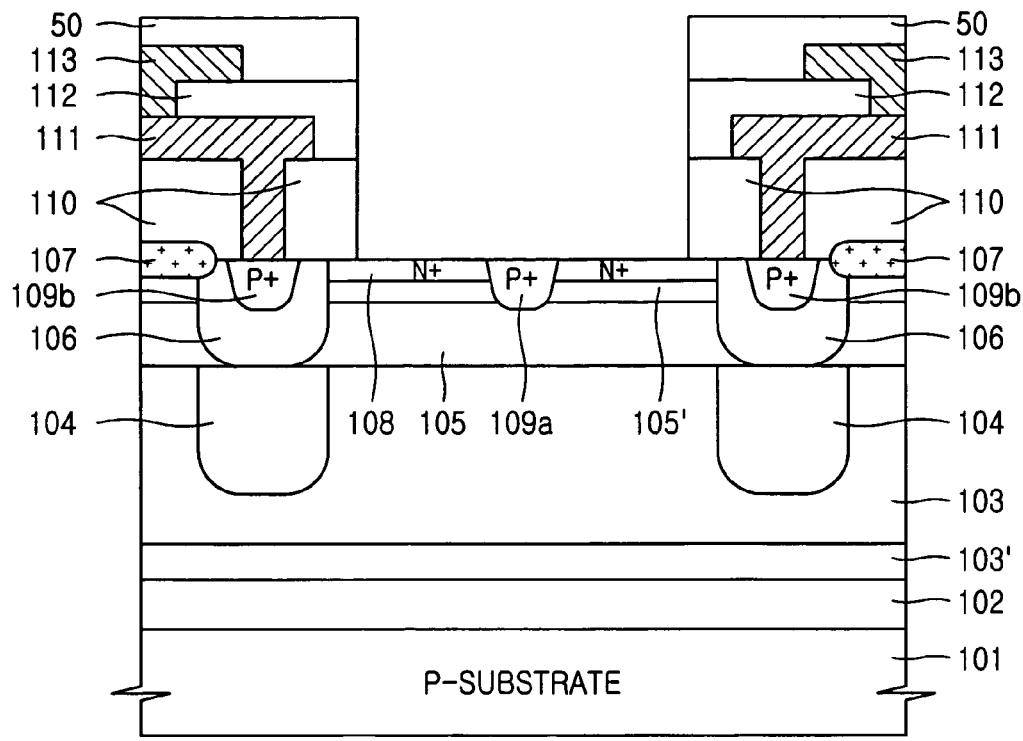
Figure 12:
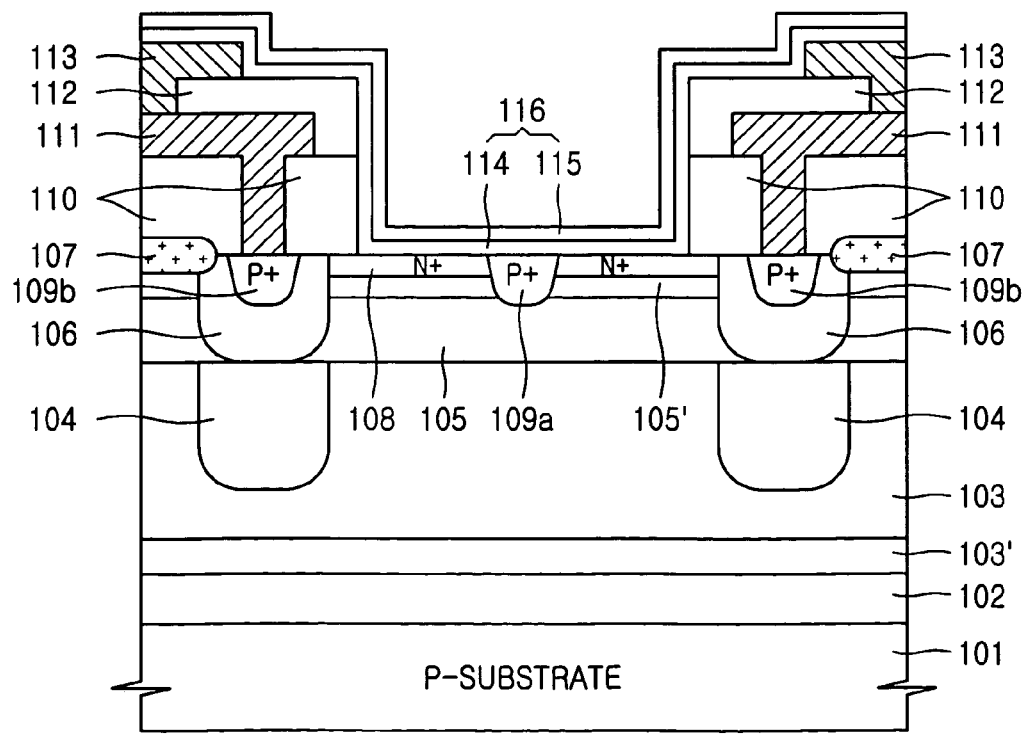

FIGS. 11 and 12 illustrate forming an anti-reflective coating (ARC) layer. More specifically, referring to FIG. 11, a photo-resist layer pattern 50 for forming a light receiving unit is formed. The intermetal insulating layer 112 and interlayer insulating layer 110 are selectively etched using the photo-resist layer pattern 50 as an etching mask, thus exposing the high density doping layers 108 and 109a of the light receiving unit. Referring to FIG. 12, the photo-resist layer pattern 50 is removed. An ARC 116 including a silicon oxide ($SiO_2$) layer 114 and a silicon nitride (SiN) layer 115 is formed on the resultant structure. The ARC is a factor determining the performance of the photodiode. The ARC may be formed to optimize the absorption of light with a wavelength.

Referring to FIG. 12, the photodiode includes the high density PBL 102, the first intrinsic capping epitaxial layer 103', the P type intrinsic epitaxial layer 103, the N type intrinsic epitaxial layer 105, and the second intrinsic capping epitaxial layer 105'. The layers are disposed on the semiconductor substrate 101. The P type first junction region 104 and the P type second junction region 106 form an electric current path. The anode electrode 111 is formed on the upper surface of the second junction region 106. The cathode electrode (not shown) is formed on the upper surface of the second intrinsic capping epitaxial layer 105'. The P+ type high density doping layer 109b is disposed between the second junction region 106 and the anode electrode 111 to decrease contact resistance of the anode electrode 111. The N+ type high density doping layer 108 is formed between the second intrinsic capping layer 105' and the cathode electrode and reduces contact resistance of the cathode electrode. The P+ type high density doping layer 109a divides the light receiving unit of the photodiode. On the anode electrode 111, the upper metal interconnecting structure 113 may be formed. The ARC 116 may also be formed on the anode electrode 111 to improve light absorption of the light receiving unit.

Diffusion of impurities from the PBL 102 to the first intrinsic epitaxial layer 103 may be prevented by the first intrinsic capping epitaxial layer 103'. The first intrinsic capping epitaxial layer 103' is disposed between the high density PBL 102 and the low density P type intrinsic epitaxial layer 103. The first intrinsic capping epitaxial layer 103' prevents the thickness and the resistivity of the first intrinsic epitaxial layer 103 from changing during a subsequent heat treatment.

The diffusion of impurities from the N+ type doping layer 108 to the second intrinsic epitaxial layer 105 may be prevented by the second intrinsic capping epitaxial layer 105'. The second intrinsic capping epitaxial layer 105' is disposed between the high density N+ type doping layer 108 and the low density N type second intrinsic epitaxial layer 105. The second intrinsic capping layer 105' prevents the thickness and the resistivity of the second intrinsic epitaxial layer 105 from changing during a subsequent heat treatment.

Figure 13:
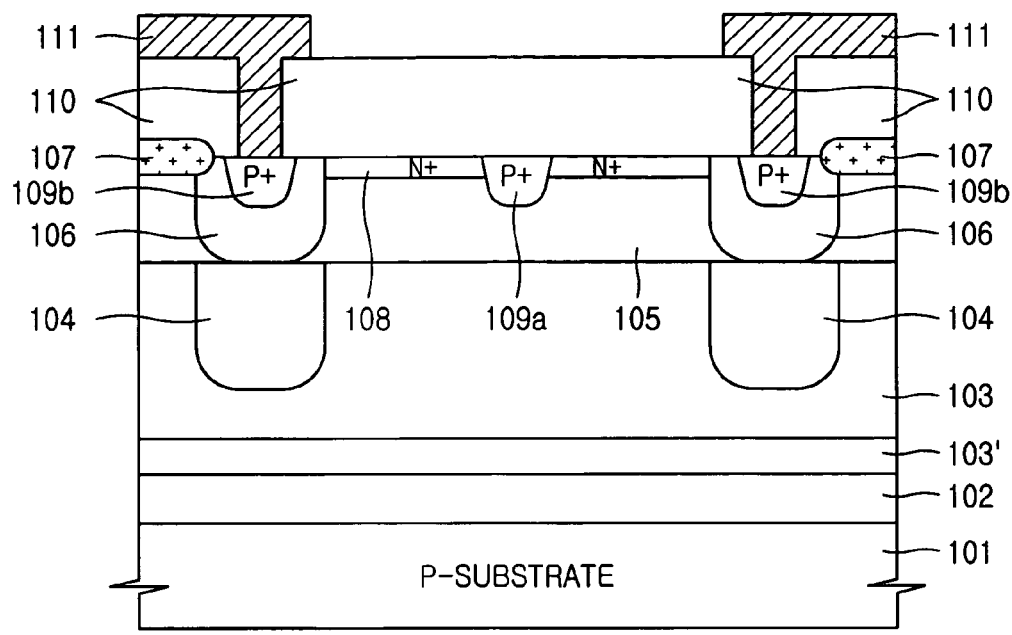
FIGS. 13 and 14 are sectional views illustrating a method of fabricating a photodiode according to another exemplary embodiment of the present invention.
Figure 14:
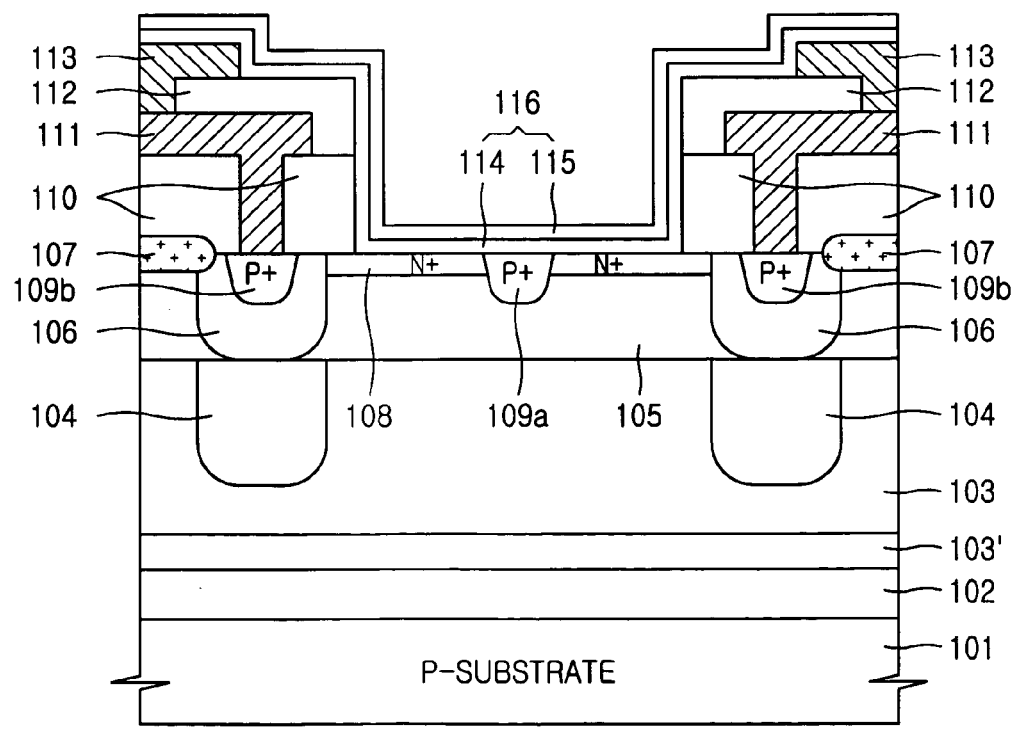

FIGS. 13 and 14 are cross-sectional schematic views of a semiconductor device, illustrating a method of fabricating a photodiode according to another exemplary embodiment of the present invention. This exemplary embodiment is similar as above, except that an intrinsic capping epitaxial layer (105' of FIG. 5) is omitted between an N type intrinsic epitaxial layer 105 and a high density N+ type doping layer 108.

Referring to FIG. 13, a PBL 102, an intrinsic capping epitaxial layer 103', and a P type intrinsic epitaxial layer 103 are formed on a semiconductor substrate 101. A first P type junction region 104 is formed in a first intrinsic epitaxial layer 103. An N type second intrinsic epitaxial layer 105 is formed on the surface of the first intrinsic epitaxial layer 103 and the P type first junction region 104. An isolation layer 107 is formed to separate the photodiode from other layers. The intrinsic capping epitaxial layer 103' may be grown without doping. Alternatively, the intrinsic capping epitaxial layer 103' may be grown with a P type doping density lower than that of the first intrinsic epitaxial layer 103. A P+ type doping layer 109b for contacting an anode 111 and a P+ type doping layer 109a for dividing a light receiving unit are formed after an N+ type doping layer 108 is formed. The doping layer 108 is formed to contact a cathode. An interlayer insulating layer 110 is formed. An anode electrode 111 in contact with the P+ type doping layer 109b and a cathode electrode (not shown) in contact with the N+ type doping layer 108 are formed.

Referring to FIG. 14, an intermetal insulating layer 112 and an upper metal interconnecting structure 113 are formed before an ARC 116. The ARC 116 includes an oxide layer 114 and a nitride layer 115 formed as described with reference to FIGS. 10 through 12.

Referring to FIG. 14, the out-diffusion of impurities from the PBL 102 to the first intrinsic epitaxial layer 103 may be blocked by the intrinsic capping epitaxial layer 103'. The intrinsic capping epitaxial layer 103' is disposed between the PBL 102 and the P type first intrinsic epitaxial layer 103 in the photodiode according to an exemplary embodiment of the present invention. The intrinsic capping epitaxial layer 103' prevents the thickness and the resistivity of the P type intrinsic epitaxial layer 103 from changing during a subsequent heat treatment.

Figure 15:
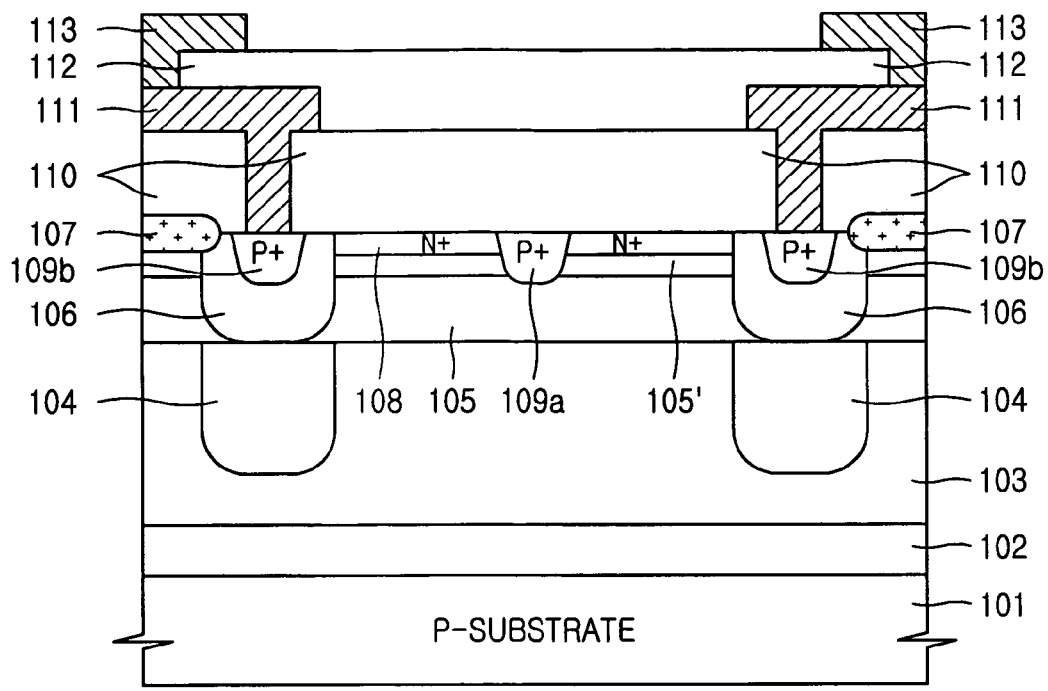
FIGS. 15 and 16 are sectional views illustrating a method of fabricating a photodiode according to another exemplary embodiment of the present invention.
Figure 16:
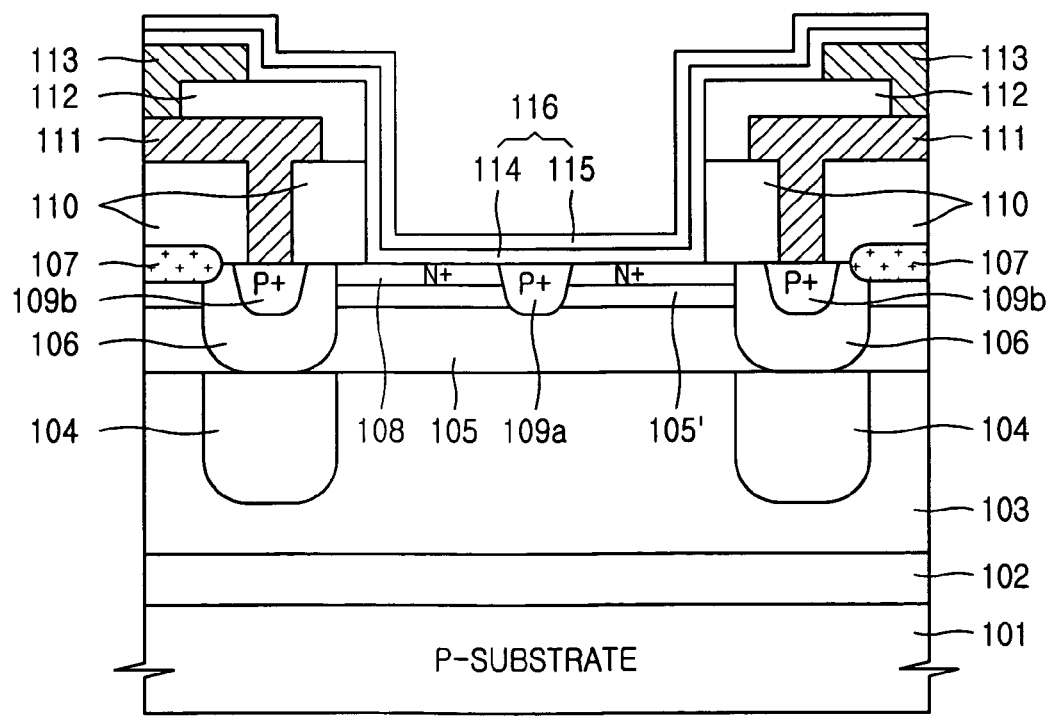

FIGS. 15 and 16 are cross-sectional schematic views of a semiconductor device, which illustrate a method of fabricating a photodiode according to yet another exemplary embodiment of the present invention. This exemplary embodiment is similar as above, except that an intrinsic capping epitaxial layer (103' of FIG. 3) is omitted between a PBL 102 and a P type intrinsic epitaxial layer 103.

Referring to FIG. 15, a PBL 102 and a P type intrinsic epitaxial layer 103 are formed on a semiconductor substrate 101. A P type first junction region 104 is formed in the P type first intrinsic epitaxial layer 103. An N type intrinsic epitaxial layer 105 and a P type second junction region 106 are formed on the surface of the P type first intrinsic epitaxial layer 103 and the P type first junction region 104. An intrinsic capping epitaxial layer 105' is formed on the N type intrinsic epitaxial layer 105. After an isolation layer 107 is formed, an N+ type doping layer 108 for contacting a cathode is formed. A P+ type doping layer 109b for contacting an anode 111 and a P+ type doping layer 109a for dividing the light receiving unit are formed. An interlayer insulating layer 110 is formed. An anode electrode 111 in contact with the P+ type doping layer 109*b* is formed. A cathode electrode in contact with the N+ type doping layer 108 is formed.

Referring to FIG. 16, an intermetal insulating layer 112 is formed and an upper metal interconnecting structure 113 is formed. An ARC 116 including an oxide layer 114 and a nitride layer 115 is formed as described with reference to FIGS. 10 through 12.

Referring to FIG. 16, the diffusion of impurities from the N+ type doping layer 108 to the second intrinsic epitaxial layer 105 may be blocked by the intrinsic capping epitaxial layer 105'. The intrinsic capping epitaxial layer 105' is disposed between the N type intrinsic epitaxial layer 105 and the N+ type doping layer 108 in the photodiode according to an exemplary embodiment of the present invention. The intrinsic capping epitaxial layer 105' prevents the thickness and the resistivity of the first intrinsic epitaxial layer 103 from changing during a subsequent heat treatment.

With photodiodes according to exemplary embodiments of the present invention, the diffusion of impurities from a buried layer to a first intrinsic epitaxial layer may be blocked by a first intrinsic capping epitaxial layer. The first intrinsic capping epitaxial layer is disposed between a high density buried layer and the first intrinsic epitaxial layer. The first intrinsic capping epitaxial layer prevents the thickness and the resistivity of the first intrinsic epitaxial layer 103 from changing during a subsequent heat treatment, thus preventing degradation of performance.

With photodiodes according to exemplary embodiments of the present invention, the diffusion of impurities from a high density doping layer to a second intrinsic epitaxial layer may be blocked by a second intrinsic capping epitaxial layer. The second intrinsic capping epitaxial layer is disposed between a high density doping layer and the second intrinsic epitaxial layer. The second intrinsic capping epitaxial layer prevents the thickness and the resistivity of the second intrinsic epitaxial layer from changing during a subsequent heat treatment, thus preventing degradation of performance.

Although exemplary embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. For example, although exemplary embodiments of the present invention have been described with reference to forming NIP photodiodes, exemplary embodiments of the present invention include methods for fabricating a PIN photodiode by changing conductive types of each layer or region on a semiconductor substrate. All such changes and modifications are intended to be included within the scope of the invention as defined by the appended claims.

What is claimed is:

1. A method of fabricating a photodiode, comprising:
    forming a buried layer of a first conductive type on a semiconductor substrate and forming a first intrinsic capping epitaxial layer on the buried layer;
    forming a first intrinsic epitaxial layer of the first conductive type on the first intrinsic capping epitaxial layer and forming a first junction region of the first conductive type in the first intrinsic epitaxial layer;
    forming a second intrinsic capping epitaxial layer on the second intrinsic epitaxial layer;
    forming a second junction region of the first conductive type such that the second junction region passes through the second intrinsic capping epitaxial layer and the second intrinsic epitaxial layer, and contacts the first junction region; and
    forming a first electrode on a surface of the second junction region and forming a second electrode on a surface of the second intrinsic capping epitaxial layer.

2. The method of claim 1, wherein forming the first electrode in the second junction region comprises:
    forming a high density doping layer of the first conductive type in the second junction region; and
    forming the first electrode in contact with the high density doping layer of the first conductive type.

3. The method of claim 1, wherein forming the second electrode on the surface of the second intrinsic capping epitaxial layer comprises:
    forming a high density doping layer of a second conductive type in the second intrinsic capping epitaxial layer; and
    forming the second electrode in contact with the high density doping layer of the second conductive type.

4. The method of claim 1, further comprising forming a high density doping layer of the first conductive type dividing a light receiving unit of the photodiode on the second intrinsic epitaxial layer.

5. The method of claim 1, further comprising forming an anti-reflective coating after forming the second electrode.

6. A method of fabricating a photodiode, comprising:
    forming a buried layer of a first conductive type on a semiconductor substrate and forming an intrinsic capping epitaxial layer on the buried layer;
    forming a first intrinsic epitaxial layer of the first conductive type on the intrinsic capping epitaxial layer and forming a first junction region of the first conductive type in the first intrinsic epitaxial layer;
    forming a second intrinsic epitaxial layer of a second conductive type on the first junction region and the first intrinsic epitaxial layer;
    forming a second junction region of the first conductive type such that the second junction region passes through the second intrinsic epitaxial layer and contacts the first junction region; and
    forming a first electrode on a surface of the second junction region and forming a second electrode on a surface of the second intrinsic epitaxial layer.

7. The method of claim 6, wherein forming the first electrode in the second junction region comprises:
    forming a high density doping layer of the first conductive type in the second junction region; and
    forming the first electrode in contact with the high density doping layer of the first conductive type.

8. The method of claim 6, wherein forming the second electrode on the surface of the second intrinsic epitaxial layer comprises:
    forming a high density doping layer of the second conductive type in the second intrinsic epitaxial layer; and
    forming the second electrode in contact with the high density doping layer.

9. The method of claim 6, further comprising forming a high density doping layer of the first conductive type dividing a light receiving unit of the photodiode on the second intrinsic epitaxial layer.

10. The method of claim 6, further comprising forming an anti-reflective coating after forming the second electrode.

11. A method of fabricating a photodiode, comprising:
    forming a buried layer of a first conductive type on a semiconductor substrate, forming a first intrinsic epitaxial layer of the first conductive type on the buried layer, and forming a first junction region of the first conductive type in the first intrinsic epitaxial layer;

forming a second intrinsic epitaxial layer of a second conductive type on the first junction region and the first intrinsic epitaxial layer;

forming an intrinsic capping epitaxial layer on the second intrinsic epitaxial layer;

forming a second junction region of the first conductive type such that the second junction region passes through the intrinsic capping epitaxial layer and the second intrinsic epitaxial layer and contacts the first junction region;

forming a first electrode on a surface of the second junction region; and forming a second electrode on a surface of the intrinsic capping epitaxial layer.

12. The method of claim 11, wherein forming the second electrode on the surface of the intrinsic capping epitaxial layer comprises:

forming a high density doping layer of the second conductive type in the intrinsic capping epitaxial layer; and forming the second electrode in contact with the high density doping layer.

13. The method of claim 11, wherein forming the first electrode in the second junction region comprises:

forming a high density doping layer of the first conductive type in the second junction region; and forming the first electrode in contact with the high density doping layer of the first conductive type.

14. The method of claim 11, further comprising forming a high density doping layer of the first conductive type dividing a light receiving unit of the photodiode on the second intrinsic epitaxial layer.

15. The method of claim 11, further comprising forming an anti-reflective coating after forming the second electrode.

16. A method of fabricating a photodiode, the method comprising:

forming a P type buried layer, a first intrinsic capping epitaxial layer, and a P type first intrinsic epitaxial layer on a P type semiconductor substrate;

forming a first P type junction region in the first intrinsic epitaxial layer;

forming an N type second intrinsic epitaxial layer on the first P type junction region and the first intrinsic epitaxial layer;

forming a second intrinsic capping epitaxial layer on the second intrinsic epitaxial layer;

forming a second P type junction region such that the second P type junction region passes through the second intrinsic capping epitaxial layer and the second intrinsic epitaxial layer and contacts the first junction region;

forming an N+ type first high density doping layer in the second intrinsic capping epitaxial layer;

forming a second P+ type high density doping layer in the first junction region and forming a third P+ type high density doping layer dividing the N+ type high density doping layer;

forming an anode in contact with the second P+ type high density doping layer; and forming a cathode in contact with the third P+ type high density doping layer.

17. The method of claim 16, further comprising forming an anti-reflective coating after forming the cathode.

18. A photodiode, comprising:

a semiconductor substrate;

a buried layer of a first conductive type on the semiconductor substrate;

a first intrinsic capping epitaxial layer on the buried layer;

a first intrinsic epitaxial layer of the first conductive type on the first intrinsic capping epitaxial layer;

a second intrinsic epitaxial layer of a second conductive type formed on the first intrinsic capping epitaxial layer;

a second intrinsic capping epitaxial layer on the second intrinsic epitaxial layer;

a first junction region of the first conductive type formed in the first intrinsic epitaxial layer;

a second junction region of the first conductive type passing through the second intrinsic capping epitaxial layer and the second intrinsic epitaxial layer and contacting the first junction region;

a first electrode on a surface of the second junction region; and a second electrode on a surface of the second intrinsic capping epitaxial layer.

19. The photodiode of claim 18 further comprising a high density doping layer of the second conductive type disposed between the second intrinsic capping epitaxial layer and the second electrode.

20. The photodiode of claim 18, further comprising a high density doping layer of the first conductive type formed in the second junction region and contacting the first electrode.

21. The photodiode of claim 18, further comprising a high density doping layer of the first conductive type formed in the second intrinsic epitaxial layer and dividing a light receiving unit of the photodiode.

22. The photodiode of claim 18, further comprising an anti-reflective coating preventing light reflection in a light receiving unit.

23. A photodiode, comprising:

a semiconductor substrate;

a buried layer of a first conductive type on the semiconductor substrate;

an intrinsic capping epitaxial layer on the buried layer;

a first intrinsic epitaxial layer of the first conductive type on the intrinsic capping epitaxial layer;

a second intrinsic epitaxial layer of a second conductive type on the first intrinsic capping epitaxial layer;

a first junction region of the first conductive type formed in the first intrinsic epitaxial layer;

a second junction region of the first conductive type passing through the second intrinsic epitaxial layer and contacting the first junction region;

a first electrode on a surface of the second junction region; and a second electrode on a surface of the second intrinsic epitaxial layer.

24. The photodiode of claim 23, further comprising a high density doping layer of the second conductive type disposed between the second intrinsic capping epitaxial layer and the second electrode.

25. The photodiode of claim 23, further comprising a high density doping layer of the first conductive type formed in the second junction region and contacting the first electrode.

26. The photodiode of claim 23, further comprising a high density doping layer of the first conductive type formed in the second intrinsic epitaxial layer and dividing a light receiving unit of the photodiode.

27. The photodiode of claim 23, further comprising an anti-reflective coating preventing light reflection in a light receiving unit.

28. A photodiode, comprising:
- a semiconductor substrate;
- a buried layer of a first conductive type on the semiconductor substrate;
- a first intrinsic epitaxial layer of the first conductive type on the buried layer;
- a second intrinsic epitaxial layer of a second conductive type on the buried layer;
- an intrinsic capping epitaxial layer on the second intrinsic epitaxial layer;
- a first junction region of a first conductive type formed in the first intrinsic epitaxial layer;
- a second junction region of the first conductive type passing through the intrinsic capping epitaxial layer and the second intrinsic epitaxial layer and contacting the first junction region;
- a first electrode on a surface of the second junction region; and
- a second electrode on a surface of the second intrinsic epitaxial layer.

29. The photodiode of claim 28, further comprising a high density doping layer of the second conductive type disposed between the intrinsic capping epitaxial layer and the second electrode.

30. The photodiode of claim 28, further comprising a high density doping layer of the first conductive type formed in the second junction region and contacting the first electrode.

31. The photodiode of claim 28, further comprising a high density doping layer of the first conductive type formed in the second intrinsic epitaxial layer and dividing a light receiving unit of the photodiode.

32. The photodiode of claim 28, further comprising an anti-reflective coating preventing light reflection in a light receiving unit.

* * * * *